(12) United States Patent
Biard et al.

(10) Patent No.: US 12,320,031 B2
(45) Date of Patent: Jun. 3, 2025

(54) METHOD FOR MANUFACTURING A COMPOSITE STRUCTURE COMPRISING A THIN LAYER MADE OF MONOCRYSTALLINE SIC ON A CARRIER SUBSTRATE MADE OF SIC

(71) Applicant: Soitec, Bernin (FR)

(72) Inventors: Hugo Biard, Grenoble (FR); Ionut Radu, Crolles (FR); Didier Landru, Le Champ-près-Froges (FR)

(73) Assignee: Soitec, Bernin (FR)

( * ) Notice: Subject to any disclaimer, the term of this patent is extended or adjusted under 35 U.S.C. 154(b) by 459 days.

(21) Appl. No.: 17/907,509

(22) PCT Filed: Jan. 12, 2021

(86) PCT No.: PCT/FR2021/050047
§ 371 (c)(1),
(2) Date: Sep. 27, 2022

(87) PCT Pub. No.: WO2021/191512
PCT Pub. Date: Sep. 30, 2021

(65) Prior Publication Data

US 2023/0160102 A1  May 25, 2023

(30) Foreign Application Priority Data

Mar. 27, 2020 (FR) ...................... 2003026

(51) Int. Cl.
*C30B 25/20* (2006.01)
*C23C 14/48* (2006.01)
(Continued)

(52) U.S. Cl.
CPC .............. *C30B 25/20* (2013.01); *C23C 14/48* (2013.01); *C23C 14/588* (2013.01); *C23C 16/01* (2013.01);
(Continued)

(58) Field of Classification Search
CPC ......... C23C 14/48; C23C 16/01; C23C 16/56; C23C 16/325; H01L 21/76254;
(Continued)

(56) References Cited

U.S. PATENT DOCUMENTS 8,436,363 B2    5/2013 Werkhoven et al.
2017/0186693 A1*  6/2017 Stamper ............ H01L 21/76852
(Continued)

FOREIGN PATENT DOCUMENTS

DE    102014103518 A1    9/2014
EP         3168862 B2    5/2017
(Continued)

OTHER PUBLICATIONS

Taiwanese Office Action and Search Report for Application No. 11221303790 dated Dec. 27, 2023, 9 pages with machine translation.
(Continued)

*Primary Examiner* — Jaehwan Oh
(74) *Attorney, Agent, or Firm* — TraskBritt (57) ABSTRACT

A method for manufacturing a composite structure comprising a thin layer made of monocrystalline silicon carbide arranged on a carrier substrate made of silicon carbide, the method comprising: a) a step of providing a donor substrate made of monocrystalline SiC, the donor substrate comprising a donor layer produced by epitaxial growth on an initial substrate, the donor layer exhibiting a density of crystal defects that is lower than that of the initial substrate; b) a step of ion implantation of light species into the donor layer, in order to form a buried brittle plane delimiting the thin layer between the buried brittle plane and a free face of the donor layer; c) a succession of n steps of formation of carrier layers, with n greater than or equal to 2, the n carrier layers being arranged on the donor layer successively on one (Continued)

another and forming the carrier substrate, each step of formation comprising a chemical vapor deposition, at a temperature of between 400° C. and 1100° C., in order to form a carrier layer made of polycrystalline SiC, the n chemical vapor depositions being carried out at n different temperatures; d) a step of separation along the buried brittle plane, in order to form, on the one hand, a composite structure comprising the thin layer on the carrier substrate and, on the other hand, the remainder of the donor substrate; and e) a step of mechanical and/or chemical treatment(s) of the composite structure.

18 Claims, 4 Drawing Sheets

(51) Int. Cl.
  *C23C 14/58* (2006.01)
  *C23C 16/01* (2006.01)
  *C23C 16/32* (2006.01)
  *C23C 16/56* (2006.01)
  *C30B 25/18* (2006.01)
  *C30B 31/22* (2006.01)
  *H01L 21/02* (2006.01)
(52) U.S. Cl.
  CPC ............ *C23C 16/325* (2013.01); *C23C 16/56* (2013.01); *C30B 25/183* (2013.01); *C30B 31/22* (2013.01); *H01L 21/02002* (2013.01)

(58) Field of Classification Search
  CPC ......... H01L 21/02002; H01L 21/02378; H01L 21/02447; H01L 21/02529; C30B 31/22
  See application file for complete search history.

(56) References Cited

U.S. PATENT DOCUMENTS

| | | | |
|---|---|---|---|
| 2018/0251910 | A1 | 9/2018 | Akiyama et al. |
| 2020/0068709 | A1* | 2/2020 | Schulze ................. H05K 1/036 |
| 2020/0224332 | A1* | 7/2020 | Hu .................... H01L 21/76254 |

FOREIGN PATENT DOCUMENTS

| | | |
|---|---|---|
| FR | 2857982 B1 | 5/2007 |
| JP | 2007-273524 A | 10/2007 |
| JP | 2009-102676 A | 5/2009 |

OTHER PUBLICATIONS

International Search Report for International Application No. PCT/FR2021/050047 dated Apr. 26, 2021, 2 pages.
International Written Opinion for International Application No. PCT/FR2021/050047 dated Apr. 26, 2021, 8 pages.
Mu et al., Room Temperature Wafer Bonding of Wide Bandgap Semiconductors, ECS Transactions, vol. 86, No. 5, (2018), pp. 3-21.

* cited by examiner

FIG. 2C(iii)

METHOD FOR MANUFACTURING A COMPOSITE STRUCTURE COMPRISING A THIN LAYER MADE OF MONOCRYSTALLINE SIC ON A CARRIER SUBSTRATE MADE OF SIC

CROSS-REFERENCE TO RELATED APPLICATIONS

This application is a national phase entry under 35 U.S.C. § 371 of International Patent Application PCT/FR2021/050047, filed Jan. 12, 2021, designating the United States of America and published as International Patent Publication WO 2021/191512 A1 on Sep. 30, 2021, which claims the benefit under Article 8 of the Patent Cooperation Treaty to French Patent Application Serial No. FR2003026, filed Mar. 27, 2020.

TECHNICAL FIELD

The present disclosure relates to the field of semiconductor materials for microelectronic components. The disclosure relates, in particular, to a process for the manufacture of a composite structure comprising a thin layer made of monocrystalline silicon carbide on a carrier substrate made of silicon carbide.

BACKGROUND

Interest in silicon carbide (SiC) has increased considerably over the last few years because this semiconductor material can increase the ability to process energy. SiC is increasingly widely used for the manufacture of innovative power devices to meet the needs of rising fields in electronics, such as, in particular, electric vehicles.

Power devices and integrated power supply systems based on monocrystalline silicon carbide are able to manage a much higher power density in comparison with their conventional homologues made of silicon, and do so with smaller active-zone dimensions. In order to further limit the dimensions of power devices on SiC, it is advantageous to manufacture vertical instead of lateral components. For this, vertical electrical conduction, between an electrode arranged on the front face of the SiC structure and an electrode arranged on the rear face, must be allowed by the structure.

Nevertheless, monocrystalline SiC substrates intended for the microelectronics industry remain expensive and difficult to supply at a large size. It is thus advantageous to resort to thin-layer transfer solutions, to prepare composite structures typically comprising a thin layer made of monocrystalline SiC on a lower cost carrier substrate. One well-known thin-layer transfer solution is the SMART CUT® process, based on implanting light ions and on assembling by direct bonding. Such a process makes it possible, for example, to manufacture a composite structure comprising a thin layer made of monocrystalline SiC (c-SiC), withdrawn from a donor substrate made of c-SiC, in direct contact with a carrier substrate made of polycrystalline SiC (p-SiC), and allowing vertical electrical conduction. Nevertheless, it remains difficult to produce good-quality direct bonding by molecular adhesion between two c-SiC and p-SiC substrates, since managing the surface state and roughness of the substrates is complex.

Various methods derived from this process are also known from the state of the art. For example, F. Mu et al. (ECS Transactions, 86 (5), 3-21, 2018) employ direct bonding, after activation of the surfaces to be assembled by bombardment with argon (SAB: "Surface Activation Bonding"): such a treatment prior to bonding generates a very high density of side bonds, which promote the formation of covalent bonds at the assembly interface, and thus a high bonding energy. Nevertheless, this method exhibits the disadvantage of generating an amorphous layer, at the surface of the donor substrate made of monocrystalline SiC, which unfavorably impacts the vertical electrical conduction between the thin layer made of c-SiC and the carrier substrate made of p-SiC.

Solutions have been proposed to solve this problem, in particular, in the document EP 3 168 862, employing an implantation of dopant entities into the amorphous layer in order to restore its electrical properties. The main disadvantage of this approach is its complexity and thus its cost.

Furthermore, the document U.S. Pat. No. 8,436,363 is known, which document describes a process for the manufacture of a composite structure comprising a thin layer made of c-SiC arranged on a metal carrier substrate, the thermal expansion coefficient of which is matched to that of the thin layer. This manufacturing process comprises the following steps:
  the formation of a buried brittle plane in a c-SiC donor substrate, delimiting a thin layer between the buried brittle plane and a front surface of the donor substrate;
  the deposition of a metal layer, for example, made of tungsten or of molybdenum, on the front surface of the donor substrate in order to form the carrier substrate with sufficient thickness to act as a stiffener; and
  the separation along the buried brittle plane, in order to form, on the one hand, the composite structure comprising the metal carrier substrate and the thin layer made of c-SiC and, on the other hand, the remainder of the donor substrate made of c-SiC.

Such a manufacturing process is, however, not compatible when the material forming the carrier substrate is p-SiC requiring deposition at temperatures above 1200° C. (usual temperatures for the manufacture of p-SiC). Specifically, at these high temperatures, the kinetics of growth of the cavities present in the buried brittle plane are faster than the kinetics of growth of the layer made of p-SiC and the thickness required for a stiffening effect is not reached before the appearance of the blistering phenomenon, related to the deformation of the layer straight above the cavities.

Whatever the layer transfer technique used, the problem is additionally posed of providing a composite structure comprising a thin layer made of c-SiC of very high quality and, in particular, devoid of extended defects (or exhibiting a very low density thereof), which are liable to affect the performance qualities and the reliability of the power devices intended to be prepared on the thin layer.

BRIEF SUMMARY

The present disclosure is an alternative solution to those of the state of the art, and is targeted at completely or partly overcoming the abovementioned disadvantages. The disclosure relates, in particular, to a process for the manufacture of a composite structure comprising a thin layer made of c-SiC of high quality arranged on a carrier substrate made of polycrystalline SiC.

The present disclosure relates to a process for the manufacture of a composite structure comprising a thin layer made of monocrystalline silicon carbide arranged on a carrier substrate made of silicon carbide. The process comprises:
  a) a step of providing a donor substrate made of monocrystalline silicon carbide, the donor substrate comprising a donor layer produced by epitaxial growth on an initial substrate, the donor layer exhibiting a density of crystal defects that is lower than that of the initial substrate;

b) a step of ion implantation of light species into the donor layer, in order to form a buried brittle plane delimiting the thin layer between the buried brittle plane and a free face of the donor layer;

c) a succession of n steps of formation of carrier layers, with n greater than or equal to 2; the n carrier layers being arranged on the donor layer successively on one another, and forming the carrier substrate; each step of formation comprising a chemical vapor deposition, at a temperature of between 400° C. and 1100° C., in order to form a carrier layer made of polycrystalline silicon carbide; the n chemical vapor depositions being carried out at n different temperatures;

d) a step of separation along the buried brittle plane, in order to form, on the one hand, a composite structure comprising the thin layer on the carrier substrate and, on the other hand, the remainder of the donor substrate; and e) a step of mechanical and/or chemical treatment(s) of the composite structure, in order to smooth the free face of the thin layer and/or in order to correct the uniformity in thickness of the composite structure.

According to other advantageous and non-limiting characteristics of the disclosure, taken alone or according to any technically attainable combination:

the depositions of step c) are carried out at a temperature of between 600° C. and 900° C., indeed even preferentially between 700° C. and 800° C.;

the depositions of step c) are based on an atmospheric pressure, low-pressure or plasma-enhanced chemical vapor deposition technique;

the n depositions of step c) are carried out at n increasing temperatures;

the n depositions of step c) are carried out at n decreasing temperatures;

at least two carrier layers among the n carrier layers deposited in step c) exhibit different doping levels;

on conclusion of the depositions of step c), the carrier substrate exhibits a thickness of greater than or equal to 50 microns, of greater than or equal to 100 microns, indeed even of greater than or equal to 200 microns;

step a) comprises the formation of a monocrystalline conversion layer on the initial substrate, prior to the epitaxial growth of the donor layer, in order to convert defects of basal plane dislocation type of the initial substrate into defects of threading edge dislocation type;

in step a), the epitaxial growth of the donor layer is carried out at a temperature of greater than 1200° C., preferentially of between 1500° C. and 1650° C.;

in step c), at least one among the n steps of formation of the carrier layers comprises an annealing carried out after the chemical vapor deposition of the step, the temperature of the annealing being greater than the deposition temperature and less than a separation temperature liable to bring about the separation of step d);

a chemical etching, a mechanical lapping and/or a chemical mechanical polishing is (are) applied to a free face of the carrier substrate, between step c) and step d);

a new chemical vapor deposition is carried out after the separation of step d), in order to thicken the carrier substrate;

step e) comprises a simultaneous chemical mechanical polishing of a front face and of a rear face of the composite structure;

the manufacturing process comprises a step of reconditioning the remainder of the donor substrate for the purpose of reuse as initial substrate or as donor substrate.

BRIEF DESCRIPTION OF THE DRAWINGS

Other characteristics and advantages of the disclosure will emerge from the detailed description of example embodiments of the disclosure that follows, with reference to the accompanying figures, in which.

DETAILED DESCRIPTION

In the descriptive part, the same references in the figures can be used for elements of the same type. The figures are diagrammatic representations that, for the sake of readability, are not to scale. In particular, the thicknesses of the layers along the z axis are not to scale with respect to the lateral dimensions along the x and y axes; and the relative thicknesses of the layers with respect to one another are not necessarily respected in the figures.

Figure 1:
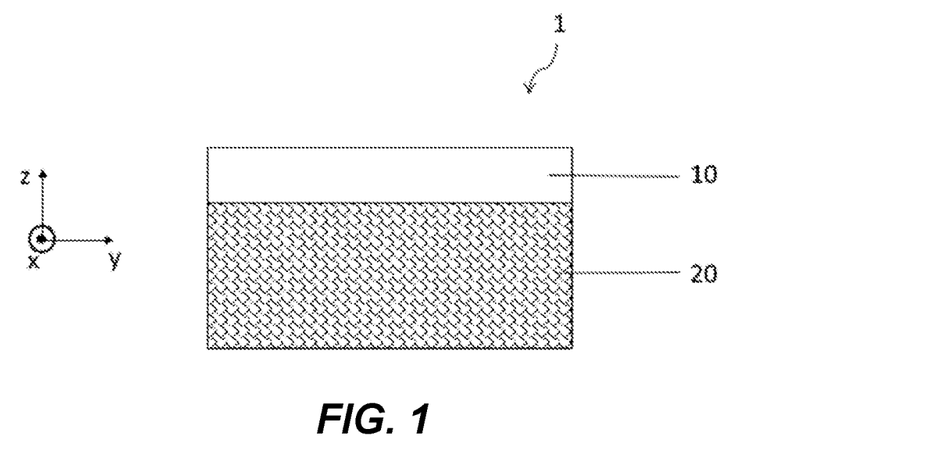
FIG. 1 exhibits a composite structure prepared according to a manufacturing process in accordance with the disclosure.

The present disclosure is a process for the manufacture of a composite structure 1 comprising a thin layer 10 made of monocrystalline silicon carbide arranged on a carrier substrate 20 made of silicon carbide (FIG. 1). The carrier substrate 20 is advantageously polycrystalline ("p-SiC" will be used subsequently to refer to polycrystalline SiC).

The process first comprises a step a) of providing a donor substrate 111 made of monocrystalline silicon carbide. In the continuation of the description, "c-SiC" will be used to refer to monocrystalline silicon carbide.

Figure 2A:
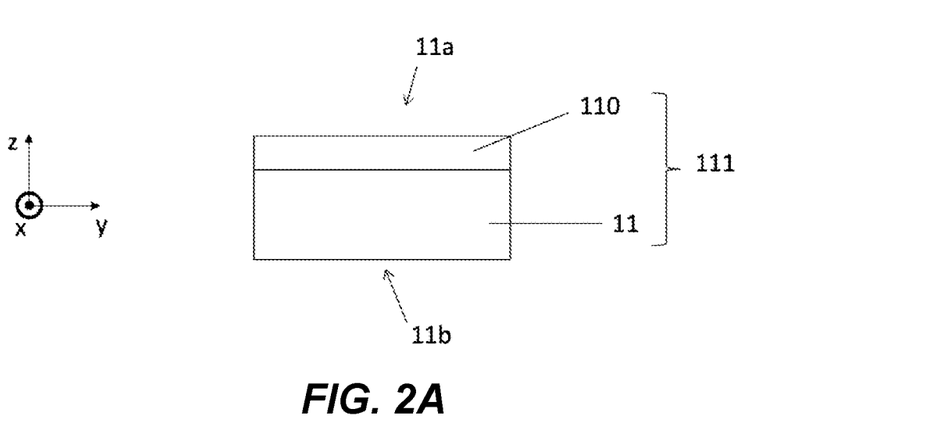
FIGS. 2A through 2F exhibit steps of a manufacturing process in accordance with the disclosure.

The donor substrate 111 comprises an initial substrate 11 made of c-SiC (FIG. 2A). The initial substrate 11 is preferentially provided in the form of a wafer with a diameter of 100 mm, 150 mm, 200 mm, indeed even 300 mm or even 450 mm, and with a thickness typically of between 300 and 800 microns. It exhibits a front face 11a and a rear face 11b. The surface roughness of the front face 11a is advantageously chosen to be less than 1 nm Ra (average roughness), measured by atomic force microscopy (AFM) in a scan of 20 microns×20 microns.

The donor substrate 111 also comprises a donor layer 110 made of c-SiC, produced by epitaxial growth on the initial substrate 11. The epitaxial growth step is carried out so that the donor layer 110 exhibits a density of crystal defects that is lower than that of the initial substrate 11.

By way of example, the initial substrate 11 made of c-SiC is of 4H or 6H polytype, exhibiting an offcut angle of less than or equal to 4.0°±0.5° with respect to the <11-20> crystallographic axis, and a density of threading dislocations (micropipes) of less than or equal to 5/cm$^2$, indeed even of less than 1/cm$^2$. Doped of N (nitrogen) type, it exhibits a resistivity preferentially of between 0.015 ohm·cm and 0.030 ohm·cm. An initial substrate 11 exhibiting a low density of defects of basal plane dislocation or BPD type, typically of less than or equal to 3000/cm$^2$, can be chosen.

c-SiC substrates exhibiting BPD densities of the order of 1500/cm² are reasonably available, which facilitates their supply.

It is desirable for the donor layer 110, from which the thin layer 10 made of c-SiC of the composite structure 1 will be formed on conclusion of the process that is a subject-matter of the disclosure, to exhibit a crystal quality that is superior to that of the initial substrate 11, in order to meet the specifications required for the vertical components intended to be prepared on the thin layer 10. This is because various types of extended defects are present in a layer or a substrate made of c-SiC. These extended defects can affect the performance qualities and the reliability of the components. In particular, defects of BPD type are fatal for bipolar components: specifically, a Shockley stacking fault (SSF) is extended from the dislocation when the energy for recombination of an electron-hole pair is available. The expansion of an SSF stacking fault inside the active region of the component brings about an increase in the passing state resistance of the component.

The donor layer 110 made of c-SiC is thus prepared so as to exhibit a density of defects of BPD type of less than or equal to 1/cm².

For this, the epitaxial growth of the donor layer 110 is carried out at a temperature of greater than 1200° C., preferentially of between 1500° C. and 1650° C. The precursors used are silane ($SiH_4$), propane ($C_3H_8$) or ethylene ($C_2H_4$); the carrier gas can be hydrogen, with or without argon.

The low content of BPD defects in the donor layer 110 is obtained by favoring the conversion of the BPD defects present in the initial substrate 11 into threading edge dislocations (TED).

Figure 3A:
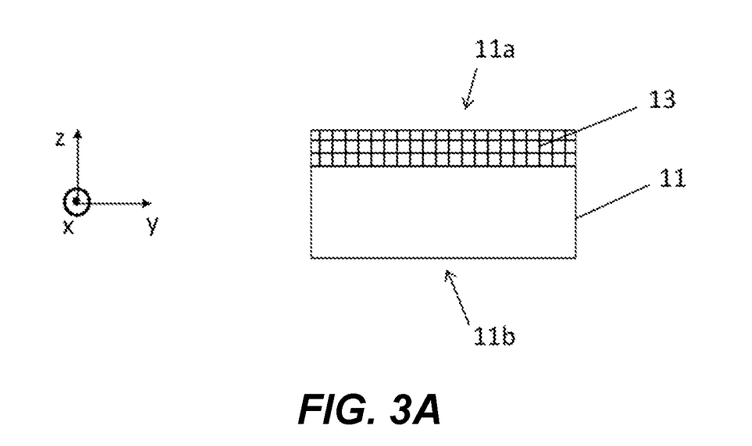
FIGS. 3A and 3B exhibit steps of a manufacturing process in accordance with the disclosure.

According to a specific embodiment, step a) comprises the formation of a monocrystalline conversion layer 13, preferentially made of c-SiC, on the initial substrate 11, prior to the growth of the donor layer 110. The aim of the monocrystalline conversion layer 13 is to maximize the conversion of the defects of BPD type of the initial substrate 11 into defects of TED type (FIG. 3A). For this, it is advantageous to choose a low cutting angle close to 4° for the initial substrate 11 made of c-SiC, to increase the in situ etching carried out before the epitaxial growth, to target high rates of growth (typically of greater than 5 μm/h) and finally to choose growth conditions for the monocrystalline conversion layer 13, with a C/Si ratio at the precursor streams of close to 1.

Figure 3B:
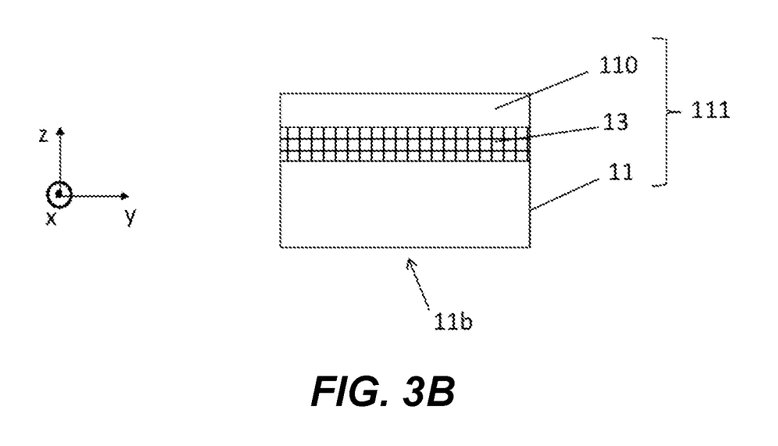

The epitaxial growth of the donor layer 110 on the monocrystalline conversion layer 13 can subsequently be carried out (FIG. 3B). According to this specific embodiment, it is also possible to obtain a donor layer 110 made of c-SiC exhibiting a density of defects of BPD type of less than or equal to 1/cm², indeed even of less than 0.1/cm². Furthermore, the probability of bipolar degradation (probability of a hole arriving under the BPD/TED conversion point) on conclusion of the process according to the present disclosure is negligible (<0.1%), the monocrystalline conversion layer 13 not being intended to be transferred into the composite structure 1. The state of the art targeted at reducing bipolar degradations consists in incorporating, between the conversion layer and the active layer, a recombination layer (nitrogen-doped beyond $1^E18$ at/cm³). This layer can, at the cost of a thickness of 10 μm and of a concentration of greater than $5^E18$/cm³, reduce the probability of holes to 0.1% with respect to the base structure not comprising this recombination layer. In the present disclosure, since the monocrystalline conversion layer 13 is not transferred, the probability of a hole reaching the nucleation point of the bipolar degradation (BPD—TED conversion point or any BPD point) is at a minimum less than 0.1%, indeed even close to 0%.

It should be noted that conventional sequences of cleaning or of etching of the initial substrate 11, targeted at removing all or some of the particulate, metallic or organic contaminants or a layer of native oxide that are potentially present on its front face 11a, can be carried out prior to the epitaxial growth.

Figure 2B:
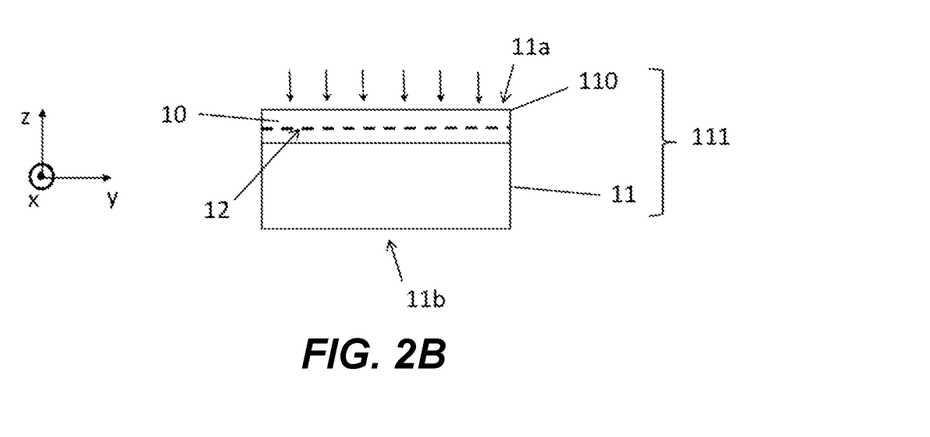
Figure 2C:
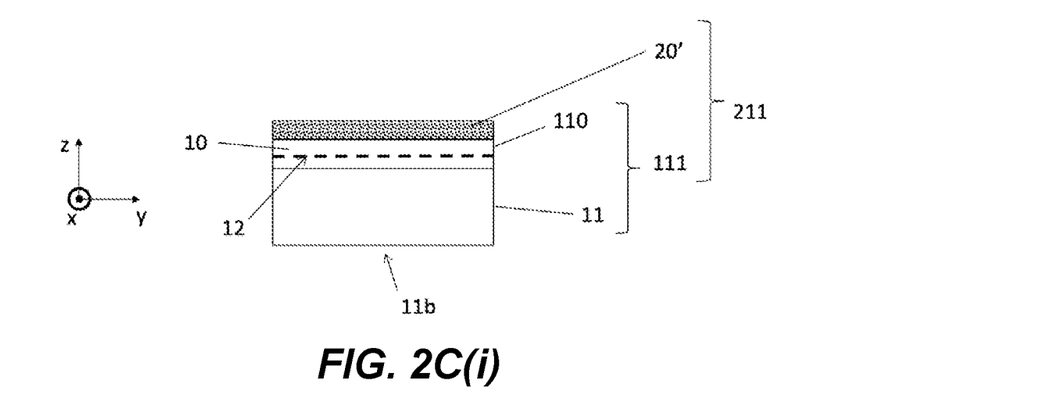

The manufacturing process, according to the disclosure, additionally comprises a step b) of ion implantation of light species into the donor layer 110 down to a predetermined depth representative of the desired thickness of thin layer 10. It should be noted that the depth will always remain less than the thickness of the donor layer 110. This implantation generates a buried brittle plane 12 in the donor layer 110 that delimits the thin layer 10 between the buried brittle plane 12 and a free surface 11a of the donor layer 110 (FIG. 2B).

The implanted light species are preferentially hydrogen, helium or a co-implantation of these two entities. As is well known with reference to the SMART CUT® process, these light species will form, around the predetermined depth, microcavities distributed in a thin layer parallel to the free surface 11a of the donor layer 110, i.e., parallel to the (x, y) plane in the figures. This thin layer is referred to as the buried brittle plane 12, for the sake of simplicity.

The energy for implantation of the light species is chosen so as to reach the determined depth in the donor substrate 111.

Typically, hydrogen ions will be implanted at an energy of between 10 keV and 250 keV, and at a dose of between $5^E16$/cm² and $1^E17$/cm², in order to delimit a thin layer 10 exhibiting a thickness of the order of 100 to 1500 nm.

It should be noted that a protective layer can be deposited on the free surface 11a of the donor layer 110 prior to the ion implantation step. This protective layer can be composed of a material such as silicon oxide or silicon nitride, for example.

The process according to the disclosure subsequently comprises a succession of n steps of formation of carrier layers 20', with n greater than or equal to 2, and advantageously greater than or equal to 3. The n carrier layers 20' are arranged on the free face 11a of the donor layer 110, successively on one another; they form the carrier substrate 20. In other words, a first carrier layer 20' is directly in contact with the front face 11a of the donor layer 110, then a second carrier layer 20' is in contact with the first, and so on for the n carrier layers 20', until the carrier substrate 20 is obtained (FIG. 2C(i), FIG. 2C(ii), and FIG. 2C(iii)).

Each step of formation comprises a chemical vapor deposition (CVD) in order to form a carrier layer 20' made of polycrystalline silicon carbide.

Each CVD deposition is carried out at a temperature of between 400° C. and 1100° C. and preferentially at a temperature of between 600° C. and 900° C., indeed even advantageously between 700° C. and 800° C. Advantageously, the depositions of step c) are based on an atmospheric pressure chemical vapor deposition (APCVD), low pressure chemical vapor deposition (LPCVD) or plasma-enhanced chemical vapor deposition (PECVD) technique.

According to the present disclosure, the n depositions of step c) are carried out at n different temperatures. This makes it possible to improve the quality of the carrier substrate 20 resulting from the superposition of the n carrier layers 20', as set out later with reference to two embodiments.

Preferentially, each carrier layer 20' exhibits a thickness of less than or equal to 150 microns, of less than or equal to 100 microns, indeed even of less than or equal to 50 microns.

According to a first embodiment, the n depositions of step c) are carried out at n increasing temperatures. By way of example, four successive depositions can be carried out at temperatures ranging from 700° C. to 1000° C. It should be noted that the thickness of the carrier layers 20' deposited during the successive depositions can be identical or different.

This embodiment is advantageous in that it limits the thermal budget applied to the donor substrate 111 at the start of formation of the carrier layers 20', that is to say when the stiffening effect of these layers is not high: thus, the risks of damage to the donor layer 110 by bubbling as a result of the growth of the cavities in the buried brittle plane 12 are greatly reduced.

Furthermore, even if the crystalline quality of the first carrier layers 20' deposited is reduced (as a result of the lower deposition temperature), the subsequent depositions carried out with increasing temperatures make it possible to restore (at least partially) and/or to improve the crystallinity of the first deposition(s).

Preferentially, the maximum temperature, that is to say the temperature applied during the final deposition n, is less than the temperature liable to be applied in the following step d) in order to carry out the separation.

According to a second embodiment, the n depositions of step c) are carried out at n decreasing temperatures. By way of example, between three and five successive depositions can be carried out at temperatures ranging from 1000° C. to 700° C.

Advantageously, the maximum temperature, that is to say the temperature applied during the first deposition, is less than the temperature anticipated in the following step d) in order to carry out the separation.

This second embodiment is targeted at forming a first carrier layer 20' on the donor layer 110 of very good crystalline quality, so as to promote the electrical conductivity of the interface between these two layers. The quality of the following carrier layers 20' will be potentially poorer (in view of the lower deposition temperatures), but the decreasing deposition temperatures make it possible to limit the growth of the cavities in the buried brittle plane 12, until the desired thickness of the carrier substrate 20 is reached. It may also be considered that carrier layers 20' deposited at increasingly low temperatures will generate increasingly small thermomechanical stresses during the cooling down to ambient temperature.

Optionally, in one or other of the embodiments described, at least one among the n steps of formation of the carrier layers 20' comprises an annealing carried out after the chemical vapor deposition. Advantageously, a temperature of the annealing will be chosen that is greater than the deposition temperature but lower than a separation temperature liable to be applied during the subsequent step d) of separation along the buried brittle plane 12.

In general, whatever the embodiment adopted, the thermal budget applied to the stack 211 during any one of the n steps of formation of a carrier layer 20' is less than the thermal budget bringing about growth of the cavities in the buried brittle plane 12 liable to deform the thin layer 10 and the n carrier layer(s) 20' formed above.

Furthermore, the total thermal budget applied to the stack 211 during the n steps of formation of carrier layers 20' remains less than the thermal budget bringing about a spontaneous separation along the buried brittle plane 12.

Step c) of the process advantageously defines a non-insulating interface between the donor layer 110 and the first carrier layer 20' deposited during the first CVD deposition. In other words, step c) is carried out so that the interface between the donor layer 110 and the first carrier layer 20' is capable of forming an electrically conductive interface, at least in the final composite structure 1: for example, a specific resistance of the interface typically of less than 1 mohm·cm$^2$ will be targeted. Advantageously, in order to ensure the electrical conductivity of the interface, removal of the native oxide present on the free face 11a of the donor layer 110 is carried out by HF (hydrofluoric acid) deoxidation, via a wet or dry route.

Prior to the deoxidation and/or to the formation of the first carrier layer 20', cleaning sequences can be applied to the donor substrate 111 so as to remove all or some of the particulate, metallic or organic contaminants potentially present on its free faces.

Advantageously, the carrier layer 20' deposited during the first CVD deposition exhibits a high doping level, in order to further promote the electrical conductivity of the interface with the donor substrate 111. Typically, the first carrier layer 20' deposited can exhibit a concentration of dopants of N or P type of between $1^E14/cm^3$ and $1^E22/cm^3$. The following carrier layers 20' that will be deposited can exhibit a different concentration and/or a different type of dopants. Thus, at least two carrier layers 20' among the n carrier layers 20' deposited in step c) can exhibit distinct doping levels.

The parameters of the deposition of step c) are advantageously determined in order for the carrier substrate 20 to exhibit a good electrical conductivity, i.e., of less than or equal to 0.03 ohm·cm, indeed even of less than or equal to 0.01 ohm·cm, a high thermal conductivity, i.e., of greater than or equal to 150 W·m$^{-1}$·K$^{-1}$, indeed even of greater than or equal to 200 W·m$^{-1}$·K$^{-1}$, and a thermal expansion coefficient similar to that of the thin layer 10, i.e., typically between $3.8^E\_6/K$ and $4.2^E\text{-}6/K$ at ambient temperature. In order to obtain these properties, the carrier substrate 20 preferentially exhibits the following structural characteristics: polycrystalline structure, grains of 3C SiC type, 111 oriented, with a mean size of 1 to 50 μm in the plane of the substrate, N-type doping for a final resistivity of less than or equal to 0.03 ohm·cm.

On conclusion of step c), the carrier substrate 20 exhibits a thickness of greater than or equal to 10 microns, of greater than or equal to 50 microns, of greater than or equal to 100 microns, indeed even a thickness of greater than or equal to 200 microns. The stack 211 resulting from step c) comprises the carrier substrate 20 arranged on the donor substrate 111.

Figure 2D:
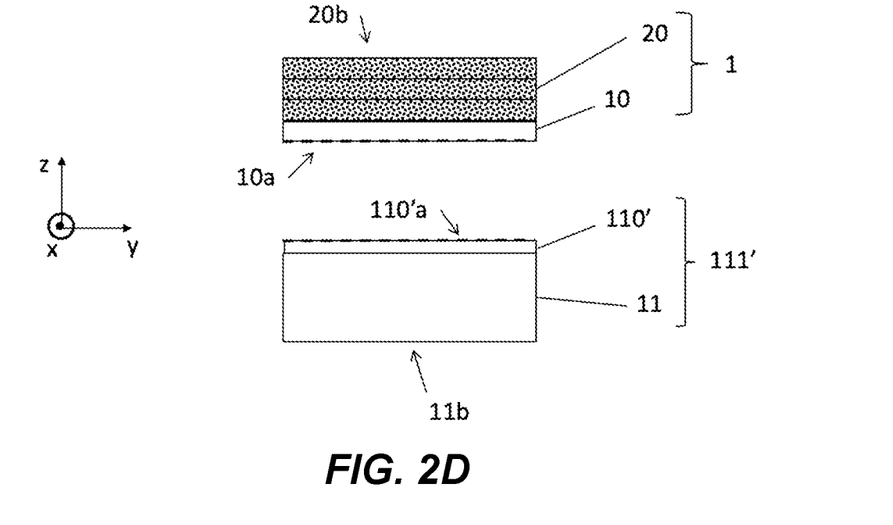

The process according to the present disclosure subsequently comprises a step d) of separation along the buried brittle plane 12, in order to form, on the one hand, the composite structure 1 and, on the other hand, the remainder 111' of the donor substrate (FIG. 2D).

According to an advantageous embodiment, the separation step d) is carried out by applying a heat treatment to the stack 211, at a separation temperature greater than the temperatures of depositions and of annealing(s) (if carried out) of step c). This is because the microcavities present in the buried brittle plane 12 follow growth kinetics until the initiation of a fracture wave, which will propagate over the entire extent of the buried brittle plane 12 and result in the separation between the composite structure 1 and the remainder of the initial substrate 111'. In practice, the temperature can be between 950° C. and 1200° C. and preferentially between 1000° C. and 1200° C., as a function of the implantation conditions of step b).

According to an alternative embodiment, the separation step d) is carried out by application of a mechanical stress to the stack 211. The stress can, for example, be exerted by the insertion of a tool (for example, a blade or a beveled form) close to the buried brittle plane 12. By way of example, the separation stress can be of the order of a few GPa, preferentially of greater than 2 GPa.

It should be noted that it is optionally possible to plan to carry out, after the separation of step d), at least one new CVD deposition in order to further thicken the carrier substrate 20.

After step d), a composite structure 1 is obtained comprising a thin layer 10 made of monocrystalline silicon carbide arranged on a carrier substrate 20 made of polycrystalline silicon carbide.

As is known per se, on conclusion of the separation step d), the free face 10a of the thin layer 10 of the composite structure 1 exhibits a surface roughness of between 5 and 100 nm RMS (by measurement with an atomic force microscope (AFM), on scans of 20 microns×20 microns).

Figure 2E:
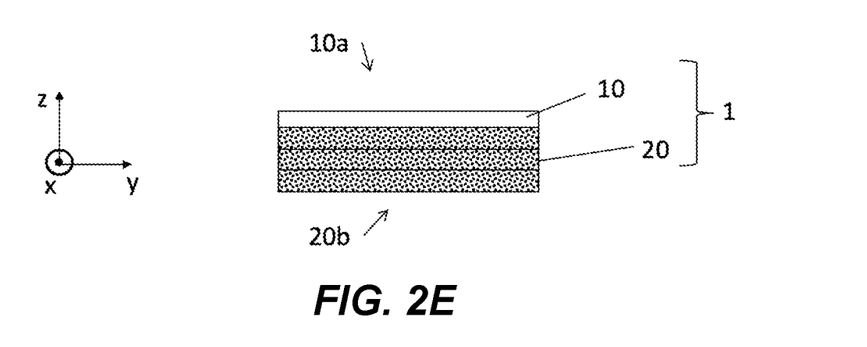

A step e) of mechanical and/or chemical treatment(s) of the composite structure 1 is thus provided in order to smooth the free surface 10a of the thin layer 10 and/or to correct the uniformity in thickness of the composite structure 1 (FIG. 2E).

Step e) can comprise a chemical mechanical polishing (CMP) of the free face 10a of the thin layer 10, typically with removal of material of the order of 50 nm to 1000 nm, so as to obtain a final roughness of less than 0.5 nm RMS (on an AFM field of 20×20 μm), indeed even of less than 0.3 nm. Step e) can also comprise a chemical or plasma (cleaning or etching) treatment, for example, a cleaning of SC1/SC2 (Standard Clean 1, Standard Clean 2) and/or HF (hydrofluoric acid) type, or an $N_2$, Ar, $CF_4$, and the like, plasma, in order to further improve the quality of the free face 10a of the thin layer 10.

Moreover, step e) can comprise a chemical mechanical polishing (CMP) and/or a chemical treatment (etching or cleaning) and/or a mechanical treatment (grinding) of the rear face 20b of the carrier substrate 20. Such a treatment makes it possible to improve the uniformity in thickness of the carrier substrate 20 and also its rear face 20b roughness. A roughness of less than 0.5 nm RMS (by measurement with an atomic force microscope (AFM) on fields of 20 microns× 20 microns) is desired in order to prepare vertical components, for which at least one metal electrode will be present on the rear face 20b of the composite structure 1.

It should be noted that these treatments applied to the rear face 20b of the carrier substrate 20 might optionally be carried out just before the separation step d), that is to say before the front face 10a of the composite structure 1 has been exposed, so as to limit its contamination, in particular, during polluting or restrictive treatments, such as chemical etching or mechanical lapping (or mechanical grinding).

Polishing or grinding of the edges of the composite structure 1 can also be carried out during this step e) in order to render the shape of its circular outline and of the edge waste compatible with the requirements of microelectronic manufacturing processes.

According to an advantageous embodiment, the step e) of chemical mechanical treatment comprises simultaneous polishing (CMP) of a front face 10a and of a rear face 20b of the composite structure 1, in order to smooth and to improve the uniformity in thickness of the structure 1. The polishing parameters can be different between the front face 10a and the rear face 20b, the smoothing of a c-SiC surface and of a p-SiC surface usually requiring different consumables. The mechanical component of the polishing is favored, in particular, for the rear face 20b when the carrier substrate 20 is made of p-SiC, in order to limit the preferential attack on the grain boundaries by the chemical component of the polishing. By way of example, the polishing parameters, such as the rotational speed (plate and polishing head), the pressure, the concentration and the physical properties of the abrasives (i.e., diameter of diamond nanoparticles between approximately 10 nm and 1 μm), can be modified in order to accentuate the mechanical component.

Still according to an advantageous embodiment, a step e') of heat treatment at a temperature of between 1000° C. and 1800° C., for approximately one hour and up to a few hours, is carried out after step e). The objective of this step is to stabilize the composite structure 1, by healing structural or surface defects, still present in and/or on the thin layer 10, and, if appropriate, by making the crystalline configuration of the carrier substrate 20 change, so that the composite structure 1 is compatible with the subsequent high-temperature heat treatments required for the manufacture of components on the thin layer 10.

Figure 2F:
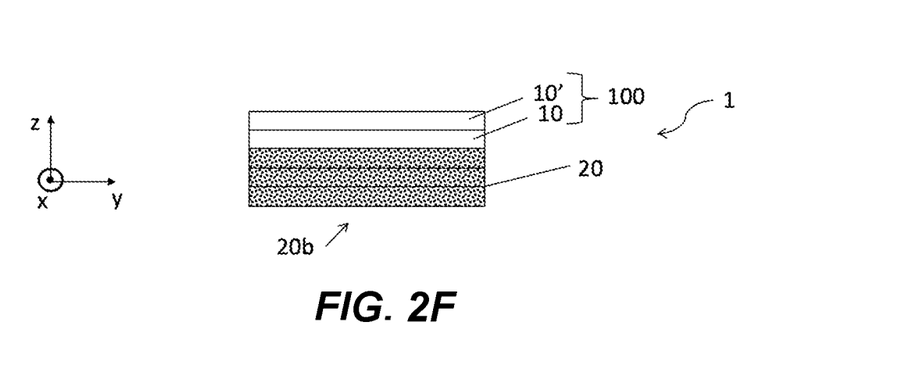

The process according to the disclosure can comprise a step f) of epitaxial growth of an additional layer 10' of monocrystalline silicon carbide on the thin layer 10 of the composite structure 1 (FIG. 2F). Such a step is applied when a relatively large thickness of working layer 100 is required for the manufacture of components, typically of the order of 5 to 50 microns. The epitaxy conditions can optionally be chosen similar to those of step a), preferentially at a lower temperature, so as to limit the stresses induced in the working layer 100 (corresponding to the thin layer 10 and additional layer 10' assembly) as a result of the heterogeneous materials of the composite structure 1.

Finally, the manufacturing process can comprise a step of reconditioning the remainder 111' of the donor substrate for the purpose of reuse as initial substrate 11 or as donor substrate 111. Such a reconditioning step is based on one or more treatments of the face 110'a (FIG. 2D), by surface or edge chemical mechanical polishing, and/or by mechanical grinding, and/or by dry or wet chemical etching. Preferentially, the thickness of the donor layer 110 formed in step a) is defined so that the remainder 111' of the donor substrate 111 can be reused at least twice as donor substrate 111. Preferentially, when the conversion layer 13 is present, care will be taken to keep the layer intact, that is to say, to always keep a portion of donor layer 110 on the remainder 111' of the donor substrate. Thus, when the portion of donor layer 10 is insufficient for the preparation of a composite structure 1, only the step of epitaxial growth of donor layer 110 is necessary and not the prior step of growth of the conversion layer 13.

Example:

According to a non-limiting exemplary embodiment, the initial substrate 11 is a wafer of c-SiC, of 4H polytype, with an orientation of 4.0°+0.50 with respect to the <11-20> axis, with a diameter of 150 mm and with a thickness of 350 μm.

A conventional cleaning sequence of RCA type (Standard Clean 1+Standard Clean 2), then Caro's acid (mixture of sulfuric acid and hydrogen peroxide) and then HF (hydrofluoric acid), is carried out on the initial substrate 11 prior to the epitaxial growth of the donor layer 110 made of c-SiC.

Growth is carried out in an epitaxy chamber, at a temperature of 1650° C., with precursors such as silane ($SiH_4$) and propane ($C_3H_8$) or ethylene ($C_2H_4$), generating the donor layer 110 made of c-SiC with a thickness of 30 microns (growth rate: 10 microns/h). The donor layer exhibits a density of BPD defects of the order of 1/cm².

The implantation of hydrogen ions is carried out at an energy of 150 keV and a dose of $6^E16$ H⁺/cm² through the free surface of the donor layer 110. A buried brittle plane 12 is thus created at a depth of approximately 800 nm in the donor layer 110.

A cleaning sequence of RCA+Caro's acid type is carried out on the donor substrate 111 so as to remove potential contaminants on the free face of the donor layer 110.

A first LPCVD deposition is carried out on the donor layer 110, at a temperature of 700° C., with the methylsilane (MS) ($CH_3SiH_3$) precursor, under a pressure of 3.7 Torr, for 60 minutes, so as to achieve a thickness of 50 microns for the first carrier layer 20'. Under these conditions, the support layer 20' is made of polycrystalline SiC.

A second LPCVD deposition is carried out on the first carrier layer 20', at a temperature of 800° C., with the MS precursor, under a pressure of 4 Torr, for 30 minutes, so as to achieve a thickness of 100 microns for the second carrier layer 20' made of p-SiC.

A third LPCVD deposition is carried out on the second carrier layer 20', at a temperature of 850° C., with the MS precursor, under a pressure of 4 Torr, for 45 minutes, so as to achieve a thickness of 250 microns for the third carrier layer 20' made of p-SiC.

The carrier substrate 20 formed by the superposition of the three carrier layers 20' exhibits a thickness of 400 microns.

An annealing at 1000° C. for 50 minutes is subsequently applied to the stack 211 formed of the donor substrate 111 and of the carrier substrate 20. Separation is carried out at the level of the buried brittle plane 12 during the annealing. On conclusion of this separation step d), the composite structure 1 formed of the thin layer 10 and of the carrier substrate 20 is separated from the remainder 111' of the donor substrate.

A thickness of the order of 50 microns is removed at the rear face 20b of the carrier substrate 20. Double-sided polishing is then carried out in order to restore the surface roughness of the thin layer 10 and of the rear face 20b of the carrier substrate 20.

Of course, the disclosure is not limited to the embodiments and to the examples described, and alternative embodiments may be introduced thereto without departing from the scope of the invention as defined by the claims.

The invention claimed is:

1. A process for the manufacture of a composite structure comprising a thin layer made of monocrystalline silicon carbide arranged on a carrier substrate made of silicon carbide, the process comprising:
  a) a step of providing a donor substrate made of monocrystalline silicon carbide, the donor substrate comprising a donor layer produced by epitaxial growth on an initial substrate, the donor layer exhibiting a density of crystal defects that is lower than that of the initial substrate;
  b) a step of ion implantation of light species into the donor layer to form a buried brittle plane delimiting the thin layer between the buried brittle plane and a free face of the donor layer;
  c) a succession of n steps of formation of carrier layers, with n greater than or equal to 2, the n carrier layers arranged on the donor layer successively on one another and forming the carrier substrate, each step of formation comprising a chemical vapor deposition, at a temperature of between 400° C. and 1100° C., to form a carrier layer made of polycrystalline silicon carbide, the n chemical vapor depositions being carried out at n different temperatures;
  d) a step of separation along the buried brittle plane to form, on the one hand, a composite structure comprising the thin layer on the carrier substrate and, on the other hand, a remainder of the donor substrate; and
  e) a step of mechanical and/or chemical treatment(s) of the composite structure to smooth the free face of the thin layer and/or to correct the uniformity in thickness of the composite structure.

2. The process of claim 1, wherein the depositions of step c) are carried out at a temperature of between 600° C. and 900° C.

3. The process of claim 1, wherein the depositions of step c) comprise an atmospheric pressure, low-pressure or plasma-enhanced chemical vapor deposition technique.

4. The process of claim 1, wherein the n depositions of step c) are carried out at n increasing temperatures.

5. The process of claim 1, wherein the n depositions of step c) are carried out at n decreasing temperatures.

6. The process of claim 1, wherein at least two carrier layers from the n carrier layers deposited in step c) exhibit different doping levels.

7. The process of claim 1, wherein, on conclusion of the depositions of step c), the carrier substrate exhibits a thickness of greater than or equal to 50 microns.

8. The process of claim 1, wherein step a) comprises the formation of a monocrystalline conversion layer on the initial substrate prior to the epitaxial growth of the donor layer to convert basal plane dislocation defects of the initial substrate into threading edge dislocation defects.

9. The process of claim 1, wherein, in step a), the epitaxial growth of the donor layer is carried out at a temperature of greater than 1200° C.

10. The process of claim 1, wherein, in step c), at least one among the n steps of formation of the carrier layers comprises an annealing carried out after the chemical vapor deposition of the step, the temperature of the annealing being greater than the deposition temperature and less than a separation temperature liable to bring about the separation of step d).

11. The process of claim 1, in which a chemical etching, a mechanical lapping and/or a chemical mechanical polishing is applied to a rear face of the carrier substrate between step c) and step d).

12. The process of claim 1, in which a new chemical vapor deposition is carried out after the separation of step d) to thicken the carrier substrate.

13. The process of claim 1, wherein step e) comprises a simultaneous chemical mechanical polishing of a front face and of a rear face of the composite structure.

14. The process of claim 1, further comprising a step of reconditioning the remainder of the donor substrate for reuse as initial substrate or as donor substrate.

15. The process of claim 2, wherein the depositions of step c) are carried out at a temperature of between 700° C. and 800° C.

16. The process of claim 7, wherein, on conclusion of the depositions of step c), the carrier substrate exhibits a thickness of greater than or equal to 100 microns.

17. The process of claim 16, wherein, on conclusion of the depositions of step c), the carrier substrate exhibits a thickness of greater than or equal to 200 microns.

18. The process of claim 9, wherein, in step a), the epitaxial growth of the donor layer is carried out at a temperature between 1500° C. and 1650° C.

\* \* \* \* \*